(12) United States Patent
Lee (10) Patent No.: US 9,738,510 B1
(45) Date of Patent: Aug. 22, 2017

(54) METHOD AND STRUCTURE OF MEMS PLCSP FABRICATION

(71) Applicant: mCube, Inc., San Jose, CA (US)

(72) Inventor: Chien Chen Lee, San Jose, CA (US)

(73) Assignee: MCUBE, INC., San Jose, CA (US)

( * ) Notice: Subject to any disclaimer, the term of this patent is extended or adjusted under 35 U.S.C. 154(b) by 0 days.

(21) Appl. No.: 14/750,820

(22) Filed: Jun. 25, 2015

Related U.S. Application Data (60) Provisional application No. 62/019,346, filed on Jun. 30, 2014.

(51) Int. Cl.
| | |
|---|---|
| *H01L 27/14* | (2006.01) |
| *B81B 7/00* | (2006.01) |
| *B81C 1/00* | (2006.01) |
| *B81B 3/00* | (2006.01) |
| *G01L 9/00* | (2006.01) |
| *H04R 31/00* | (2006.01) |
| *G01C 19/5719* | (2012.01) |

(52) U.S. Cl.
CPC .......... *B81B 7/0077* (2013.01); *B81B 3/0035* (2013.01); *B81B 3/0062* (2013.01); *B81B 3/0072* (2013.01); *B81C 1/00134* (2013.01); *B81C 1/00158* (2013.01); *B81C 1/00269* (2013.01); *G01C 19/5719* (2013.01); *G01L 9/0042* (2013.01); *H04R 31/00* (2013.01); *B81B 2201/025* (2013.01); *B81B 2201/0235* (2013.01); *B81B 2201/0242* (2013.01); *B81B 2201/0264* (2013.01)

(58) Field of Classification Search
None
See application file for complete search history.

(56) References Cited

U.S. PATENT DOCUMENTS

| | | | |
|---|---|---|---|
| 8,637,943 B1 * | 1/2014 | Yang | B81C 1/0023 257/252 |
| 2012/0074590 A1 * | 3/2012 | Lin | B81C 1/00269 257/777 |
| 2013/0236988 A1 * | 9/2013 | Sridharamurthy | H01L 29/66007 438/3 |
| 2015/0166330 A1 * | 6/2015 | Lee | B81C 1/00301 257/418 |

* cited by examiner

*Primary Examiner* — Minh-Loan Tran
(74) *Attorney, Agent, or Firm* — Richard T. Ogawa; Ogawa P.C.

(57) ABSTRACT

A method and structure for a PLCSP (Package Level Chip Scale Package) MEMS package. The method includes providing a MEMS chip having a CMOS substrate and a MEMS cap housing at least a MEMS device disposed upon the CMOS substrate. The MEMS chip is flipped and oriented on a packaging substrate such that the MEMS cap is disposed above a thinner region of the packaging substrate and the CMOS substrate is bonding to the packaging substrate at a thicker region, wherein bonding regions on each of the substrates are coupled. The device is sawed to form a package-level chip scale MEMS package.

20 Claims, 8 Drawing Sheets

METHOD AND STRUCTURE OF MEMS PLCSP FABRICATION

CROSS-REFERENCES TO RELATED APPLICATIONS

The present application is a non-provisional of: U.S. Provisional App. No. 62/019,346, filed Jun. 30, 2014 and incorporates it, by reference, for all purposes. The present application also incorporates by reference, for all purposes, U.S. patent application Ser. No. 14/507,177 filed Oct. 6, 2014, and U.S. Provisional App. No. 61/887,214, filed Oct. 4, 2013.

BACKGROUND OF THE INVENTION

The present invention is directed to MEMS (Micro-Electro-Mechanical-Systems). More specifically, embodiments of the invention provide methods and structure for improving integrated MEMS devices, including inertial sensors and the like.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving fabrication techniques for IC devices and MEMS are highly desired.

BRIEF SUMMARY OF THE INVENTION

The present invention is directed to integrated MEMS (Micro-Electro-Mechanical-Systems) IC (Integrated Circuit) devices. More specifically, embodiments of the invention provide a method and structure for a MEMS PLCSP (Package Level Chip Scale Package) fabrication, including one or more discrete MEMS devices. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much greater range of applicability.

Embodiments of the present invention include a method and structure of a PLCSP MEMS-IC packaged device or a package-level chip scale MEMS package. The method can include providing a MEMS chip comprising a CMOS substrate having a top surface having a first portion and a second portion and comprising a cap disposed upon the first portion of the CMOS substrate, wherein the CMOS substrate is associated with a first thickness, wherein the cap is associated with a second thickness, wherein the cap and the first portion of the top surface form an enclosed cavity, wherein at least a MEMS device is formed on the first portion of the top substrate and disposed within the enclosed cavity, wherein the second portion of the top surface of the CMOS substrate is substantially free of the cap and includes at least a first bonding region.

The method also includes providing a packaging substrate having a top surface having a top surface having a first portion and a second portion, wherein the first portion is characterized by a third thickness, wherein the second portion is characterized by a fourth thickness, wherein the third thickness exceeds the fourth thickness by at least the second thickness associated with the cap, wherein the first portion of the top surface of the packaging substrate includes at least a second bonding region.

The method also includes orienting the MEMS chip relative to the packaging substrate such that the second portion of the top surface of the CMOS substrate is opposed to the first portion of the top surface of the packaging substrate, and such that the MEMS cap is disposed above the second portion of the top surface of the packaging substrate, bonding the first bonding region to the second bonding region, and separating a first substrate region of the packaging substrate away from a second substrate region, wherein the second substrate region forms the package-level chip scale MEMS package. In a specific embodiment, the separating the portion of the packing substrate comprises using a package saw to remove the portion of the packing substrate to form the package-level chip scale MEMS package.

In an embodiment, the device includes a MEMS chip comprising a CMOS substrate having a top surface having a first portion and a second portion and comprising a cap disposed upon the first portion of the CMOS substrate, wherein the CMOS substrate is associated with a first thickness, wherein the cap is associated with a second thickness, wherein the cap and the first portion of the top surface form an enclosed cavity, wherein at least a MEMS device is formed on the first portion of the top surface and disposed within the enclosed cavity, wherein the second portion of the top surface of the CMOS substrate is substantially free of the cap and includes at least a first bonding region.

The device includes a packaging substrate having a top surface, the top surface having a first portion and a second portion, wherein the first portion is characterized by a third thickness, wherein the second portion is characterized by a fourth thickness, wherein the third thickness exceeds the fourth thickness by at least the second thickness associated with the cap, wherein the first portion of the top surface of the packaging substrate includes at least a second bonding region.

In a specific embodiment, the MEMS chip is oriented relative to the packaging substrate such that the second portion of the top surface of the CMOS substrate is opposed to the first portion of the top surface of the packaging substrate, and such that the MEMS cap is disposed above the second portion of the top surface of the packaging substrate, and the first bonding region is bonded to the second bonding region.

Many benefits are achieved by way of embodiments of the present invention over conventional techniques. In one or more embodiments, the PLCSP type packaging can result in a smaller form factor compared with the standard packaging type and lower packaging cost compared to WLP processes. Also, this unique package type and process eliminates the wire bonding and mold compound encapsulation processes to achieve a compact PLCSP. Depending upon the embodiment, one or more of these benefits may be achieved. These and other benefits will be described in more detail throughout the present specification and more particularly below.

Various additional objects, features, and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

The present invention is directed to integrated MEMS (Micro-Electro-Mechanical-Systems) IC (Integrated Circuit) devices. More specifically, embodiments of the invention provide a method and structure for a MEMS WLCSP (Wafer Level Chip Scale Package) fabrication, including one or more discrete MEMS devices. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much greater range of applicability.

Various mobile and wearable applications of integrated MEMS-IC devices find small package form factors and lower costs very desirable. CSP (chip scale packaging) generally implies that the package must have a length that is no greater than 0.2 times the die size. There are various conventional methods of CSP, but these methods have been inadequate for the desired applications.

Figure 1A:
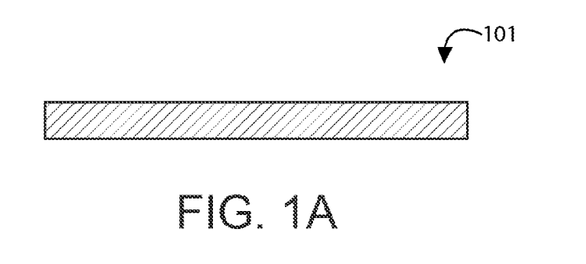
FIGS. 1A-1F are simplified diagrams illustrating a conventional method for forming a package-level chip scale MEMS package.
Figure 1B:
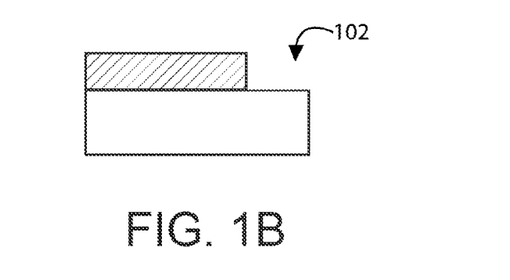
Figure 1C:
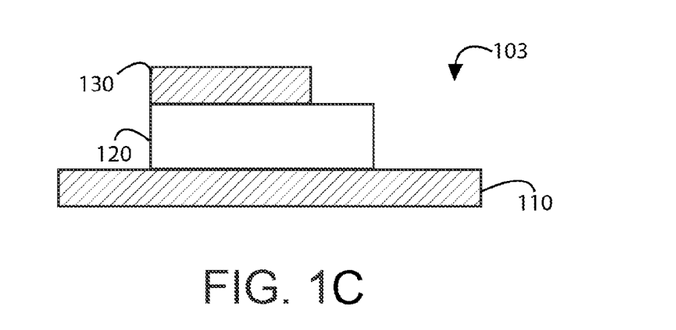
Figure 1D:
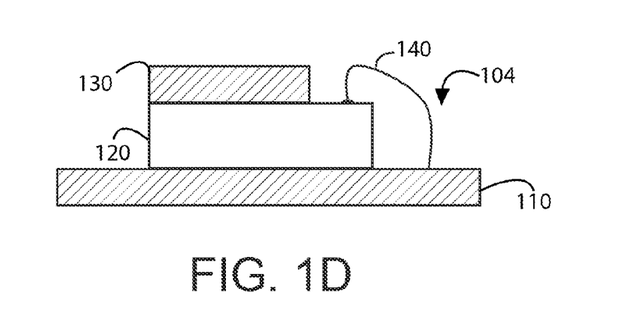
Figure 1E:
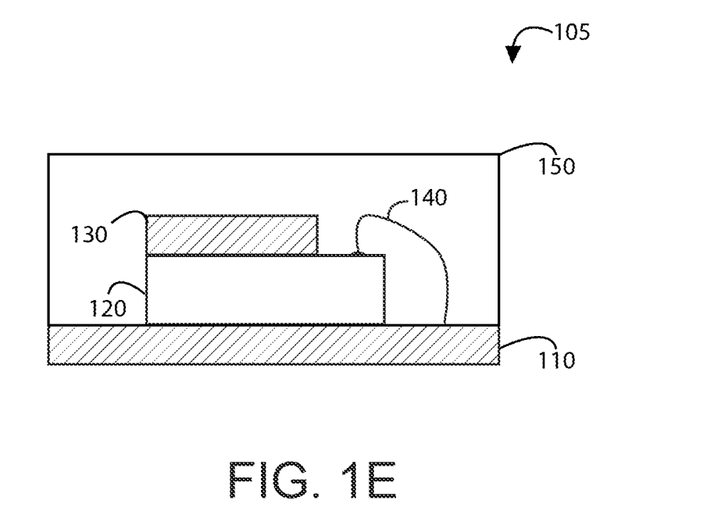
Figure 1F:
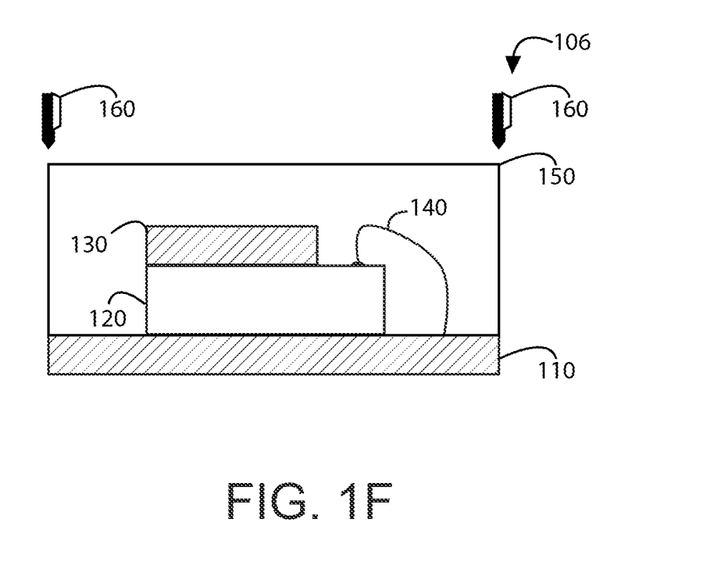

FIGS. 1A-1F are simplified diagrams illustrating a conventional method for forming a package-level chip scale MEMS package. The method illustrated here depicts a conventional MEMS package process flow 101. FIGS. 1A and 1C (101) shows an incoming substrate 110, while FIGS. 1B and 1C (102) shows an incoming chip having a cap 130 overlying a die 120. The incoming chip is mounted in FIG. 1C (103), which shows the die 120 attached to the substrate 110. The die 120 is then wire-bonded 140 to the substrate 110 in FIG. 1D (104). The device is enclosed in an encapsulation 150 in FIG. 1E (105), and then the package is subjected to a sawing process by saws 160 in FIG. 1F (106).

Referring to the previously described figures, the standard package size is much larger than that of the actual chip size. For example, in the case of a 1.08×1.08 mm$^2$ MEMS die, the minimum package size would be 1.4×1.6 mm$^2$. Using a WLP (wafer level package) would result in a package size exactly the same as the chip size itself. Using the previous example, the WLP package size would be the same is the 1.08×1.08 mm$^2$ MEMS die. However, the WLP assembly process is very different from the existing die form process, requiring that the WLP process be followed by wafer form assembly processes. Due to the process difference, there is a tradeoff between cost, size, and production cycle time in considering various approaches.

In an embodiment, the present invention provides a structure and method for forming a PLCSP (package-level chip scale package) for a MEMS device. This PLCSP type packaging can result in a smaller form factor compared with the standard packaging type and lower packaging cost compared to WLP processes. For example, the minimum package size of the PLCSP type with the 1.08×1.08 mm$^2$ MEMS die would be 1.3×1.3 mm$^2$.

Figure 2A:
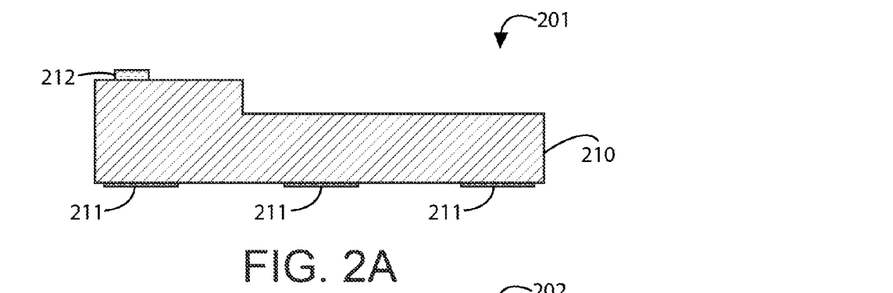
FIGS. 2A-2F are simplified diagrams illustrating a method for forming a package-level ship scale MEMS package according to an embodiment of the present invention.
Figure 2B:
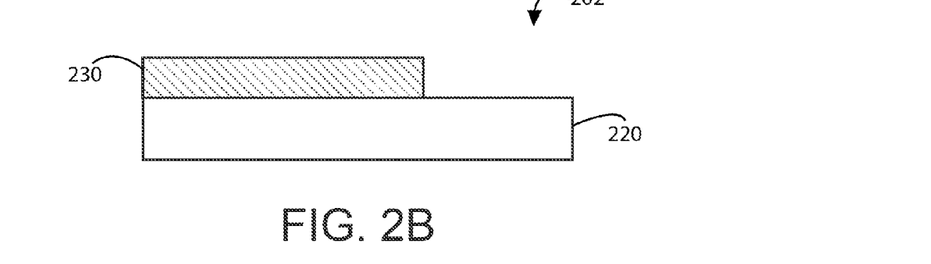

FIGS. 2A-2F are simplified diagrams illustrating a method for forming a package-level ship scale MEMS package according to an embodiment of the present invention. The method illustrated here depicts a PLCSP MEMS package process flow. FIG. 2A (201) shows an incoming substrate 210 with contact regions 211 and an interconnection region 212. FIG. 2B (202) shows an incoming chip having a MEMS cap 230 overlying a CMOS die 220. In an embodiment, the incoming chip is a processed MEMS-CMOS device with the MEMS cap 230 housing at least a MEMS device interconnected to the CMOS die 220.

Figure 2C:
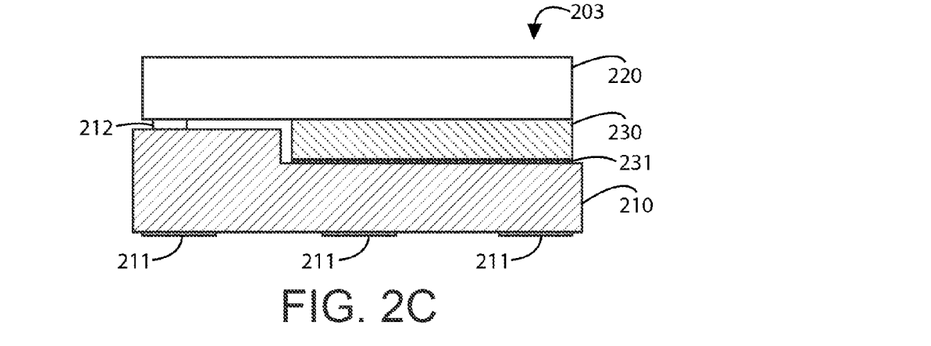

FIG. 2C (203) shows the incoming chip flipped and attached to the substrate 210. Here, the MEMS cap 230 is coupled to the substrate 210 and the CMOS die 220 is coupled to the interconnection region 212. In a specific embodiment, an interconnect layer 231, such as a dielectric layer, can be provided between the MEMS cap 230 and the substrate 210. The device is then subjected to a reflow process 240 in FIG. 2D (204), which can be used to melt one or more metal materials to form interconnections. The device is enclosed in an encapsulation 250 in FIG. 2E (205) and a package sawing process using saws 260 in FIG. 2F (206).

Figure 2D:
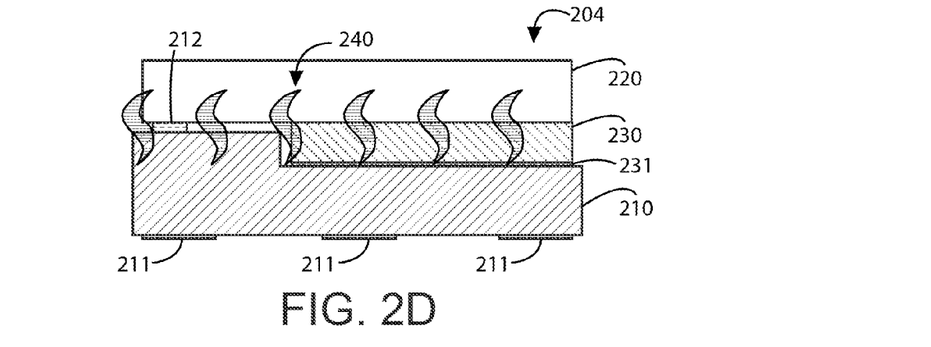
Figure 2E:
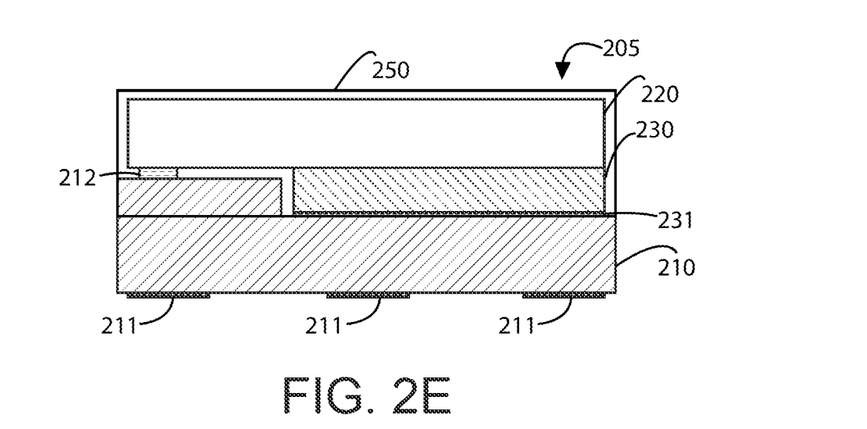
Figure 2F:
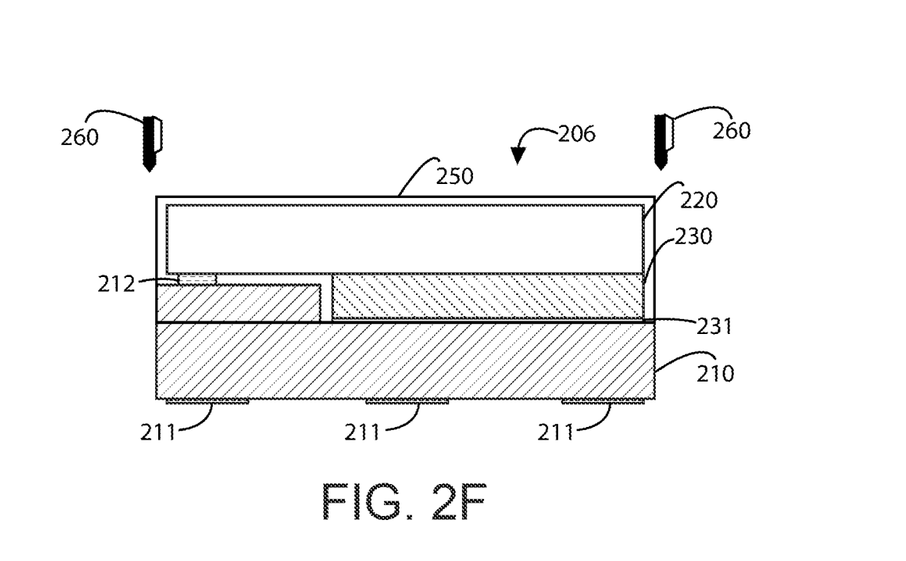

In a specific embodiment, the interconnection region 212 can be a pre-solder bump. During the die attachment process, the pre-solder bump can be coupled to one or more bond pads on the CMOS die 220. This interconnection can then be soldered together via the reflow process 240 to form a robust interconnection between die 220 and substrate 210. This unique package type and process eliminates the wire bonding and mold compound encapsulation processes to achieve a compact PLCSP.

In an embodiment, the present invention provides a method for forming a package-level chip scale MEMS package. This method can include providing a MEMS chip comprising a CMOS substrate having a top surface having a first portion and a second portion and comprising a cap disposed upon the first portion of the CMOS substrate, wherein the CMOS substrate is associated with a first thickness, wherein the cap is associated with a second thickness, wherein the cap and the first portion of the top surface form an enclosed cavity, wherein at least a MEMS device is formed on the first portion of the top surface and disposed within the enclosed cavity, wherein the second portion of the top surface of the CMOS substrate is substantially free of the cap and includes at least a first bonding region.

The method also includes providing a packaging substrate having a top surface having a top surface having a first portion and a second portion, wherein the first portion is characterized by a third thickness, wherein the second portion is characterized by a fourth thickness, wherein the third thickness exceeds the fourth thickness by at least the second thickness associated with the cap, wherein the first portion of the top surface of the packaging substrate includes at least a second bonding region.

The method also includes orienting the MEMS chip relative to the packaging substrate such that the second portion of the top surface of the CMOS substrate is opposed to the first portion of the top surface of the packaging substrate, and such that the MEMS cap is disposed above the second portion of the top surface of the packaging substrate, bonding the first bonding region to the second bonding region, and separating a first substrate region of the packaging substrate away from a second substrate region, wherein the second substrate region forms the package-level chip scale MEMS package. In a specific embodiment, the separating the portion of the packing substrate comprises using a package saw to remove the portion of the packing substrate to form the package-level chip scale MEMS package.

In a specific embodiment, the device can be characterized by specific layer thicknesses. The sum of the first thickness for the CMOS substrate and the second thickness for the cap is within a range of about 450 microns to about 500 microns. The first thickness for the CMOS substrate is within a range of about 300 microns to about 400 microns. The second thickness for the cap is within a range of about 100 microns to about 150 microns. The third thickness associated with the first portion of the packaging substrate is within a range of about 100 microns to about 200 microns. The thickness of the package-level chip scale MEMS package is within a range of about 650 microns to about 750 microns.

In a specific embodiment, the top surface of the CMOS substrate can also include a third portion, and wherein third portion of the top surface of the CMOS substrate is substantially free of the cap and includes at least a third bonding region. The top surface of the packing substrate can also include a third portion, wherein the third portion is characterized by the third thickness, and wherein the third portion of the top surface of the packaging substrate includes at least a fourth bonding region. The orienting the MEMS chip relative to the packaging substrate can further comprise orienting the MEMS chip relative to the packing substrate such that the third portion of the top surface of the CMOS substrate is opposed to the third portion of the top surface of the packaging substrate. And the method can also include bonding the third bonding region to the fourth bonding region.

In a specific embodiment, the second substrate portion is characterized by a first area and the MEMS chip is characterized by a second area. In a specific embodiment, the first area is larger than the second area within a range of about 40% to 50%.

In a specific embodiment, the MEMS device is selected from a group consisting of: an accelerometer, a gyroscope, a magnetometer, a pressure sensor.

Many benefits are achieved by way of embodiments of the present invention over conventional techniques. In one or more embodiments, the PLCSP type packaging can result in a smaller form factor compared with the standard packaging type and lower packaging cost compared to WLP processes. For example, the minimum package size of the PLCSP type with a 1.08×1.08 mm$^2$ MEMS die would be 1.3×1.3 mm$^2$. Depending upon the embodiment, one or more of these benefits may be achieved.

Figure 3A:
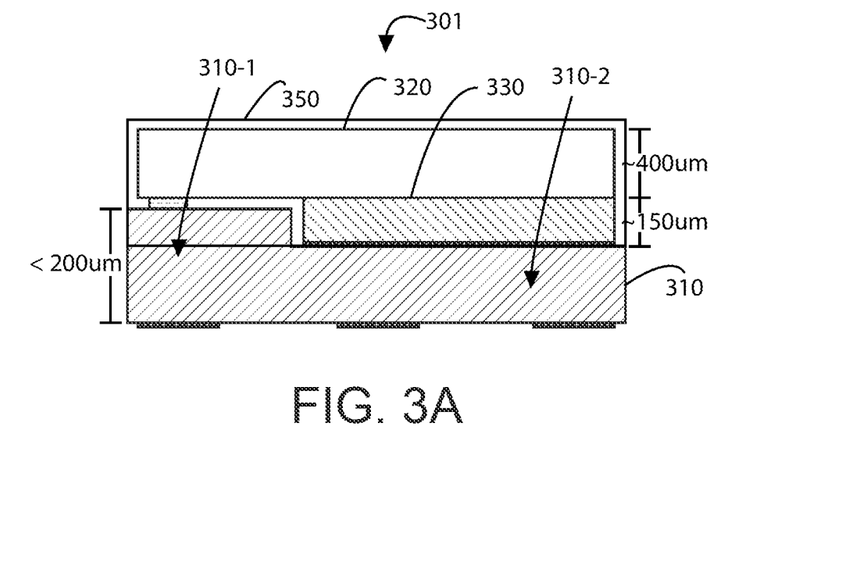
FIG. 3A is a simplified diagram of a packaged MEMS-IC device according to an embodiment of the present invention.

FIG. 3A is a simplified diagram of a stacked MEMS-IC device according to an embodiment of the present invention. As shown, device 301 includes the flip chip oriented PLCSP package described in FIGS. 2A-2E. In a specific embodiment, the substrate 310 also includes a thicker region 310-1 and a thinner region 310-2. Here, the thinner region 310-2 is configured to accommodate the MEMS cap 330, whereas the thicker region 310-1 provides a stronger bond area for coupling of the substrate 310 to the CMOS die 320. This is a single side bond pad interconnection configuration according to an embodiment of the present invention. In a specific embodiment, the CMOS and MEMS can have a thickness of about 450 to 550 um. The CMOS die 320 can have a thickness of about 400 um, the MEMS cap 330 can have a thickness of about 150 um, and the substrate can have a thickness of less than 200 um. Also, the device can be enclosed in an encapsulation 350.

In an embodiment, the present invention provides A package-level chip scale MEMS packaged device. The device can include a MEMS chip comprising a CMOS substrate having a top surface having a first portion and a second portion and comprising a cap disposed upon the first portion of the CMOS substrate, wherein the CMOS substrate is associated with a first thickness, wherein the cap is associated with a second thickness, wherein the cap and the first portion of the top surface form an enclosed cavity, wherein at least a MEMS device is formed on the first portion of the top surface and disposed within the enclosed cavity, wherein the second portion of the top surface of the CMOS substrate is substantially free of the cap and includes at least a first bonding region.

The device can include a packaging substrate having a top surface, the top surface having a first portion and a second portion, wherein the first portion is characterized by a third thickness, wherein the second portion is characterized by a fourth thickness, wherein the third thickness exceeds the fourth thickness by at least the second thickness associated with the cap, wherein the first portion of the top surface of the packaging substrate includes at least a second bonding region.

In a specific embodiment, the MEMS chip is oriented relative to the packaging substrate such that the second portion of the top surface of the CMOS substrate is opposed to the first portion of the top surface of the packaging substrate, and such that the MEMS cap is disposed above the second portion of the top surface of the packaging substrate, and the first bonding region is bonded to the second bonding region.

In a specific embodiment, the device embodiment can include similar elements as described for the method embodiment. The MEMS device is selected from a group consisting of: an accelerometer, a gyroscope, a magnetometer, a pressure sensor, or the like and combinations thereof.

Figure 3B:
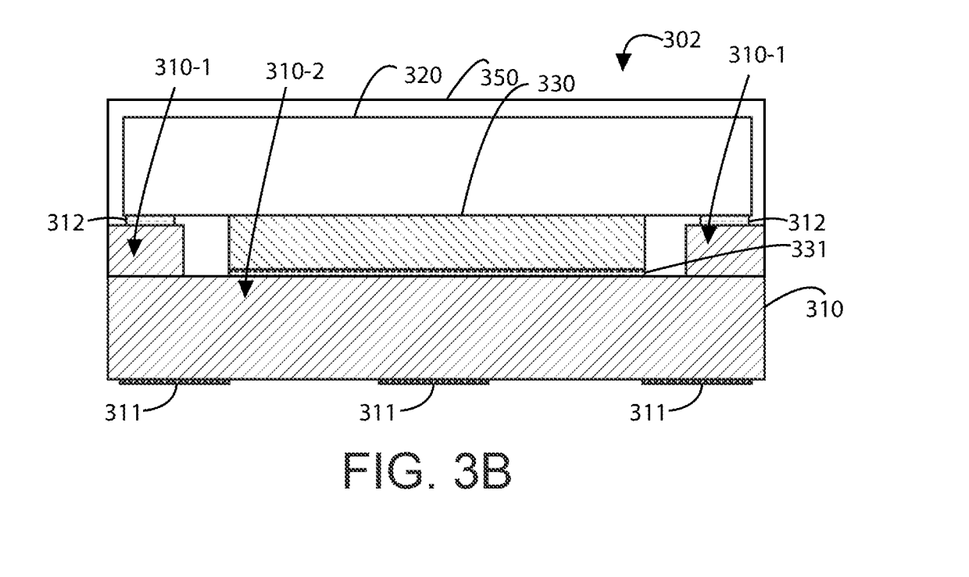
FIG. 3B is a simplified diagram of a packaged MEMS-IC device according to an embodiment of the present invention.

FIG. 3B is a simplified diagram of a stacked MEMS-IC device according to an embodiment of the present invention. As shown, device 302 depicts a dual side bond pad interconnection configuration. The substrate 310 has contact regions 311 and interconnection regions 312. The interconnection regions 312 can be configured on thicker regions 310-1. The MEMS cap 330 is configured within the recessed region overlying the thinner region 310-2 of the substrate and the CMOS die 320 is coupled to the interconnection regions 312. Also, the device can be enclosed in an encapsulation 350. Those of ordinary skill in the art will recognize other variations, modifications, and alternatives.

Figure 4A:
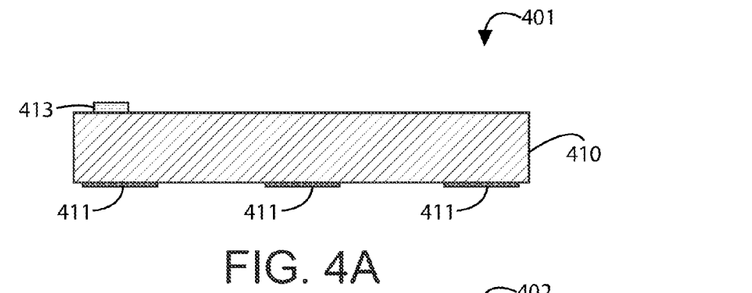
FIGS. 4A-4F are simplified diagrams illustrating a method for forming a package-level ship scale MEMS package according to an embodiment of the present invention.

FIGS. 4A-4F are simplified diagrams illustrating a method for forming a package-level ship scale MEMS package according to an embodiment of the present invention. The method illustrated here depicts another PLCSP MEMS package process flow. FIG. 4A (401) shows an incoming substrate 410 with contact regions 411 and an interconnection region 413. This interconnection region 413 can include solder paste from a solder paste printing process on the substrate 410. Compared to the substrate of FIGS. 2A-2F, this substrate 410 is flat, without a thicker or thinner region.

Figure 4B:
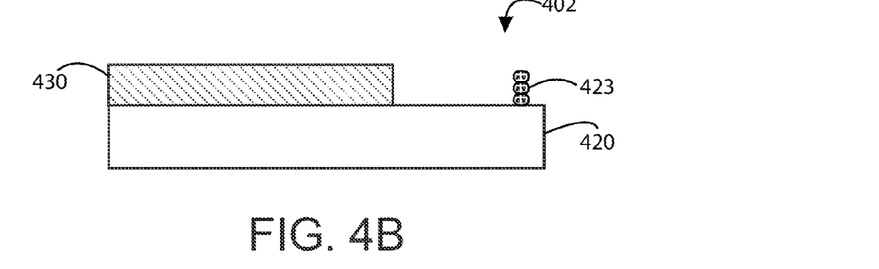

FIG. 4B (402) shows an incoming chip having a MEMS cap 430 overlying a CMOS die 420. In an embodiment, the incoming chip is a processed MEMS-CMOS device with the MEMS cap 430 housing at least a MEMS device interconnected to the CMOS die 420. Here, the CMOS die 420 includes a CMOS interconnection region 423, which can include one or more gold stub bumps. There can be other variations, modifications, and alternatives.

Figure 4C:
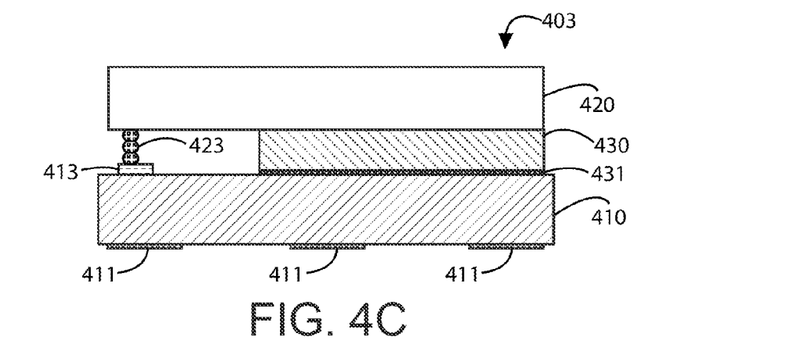
Figure 4D:
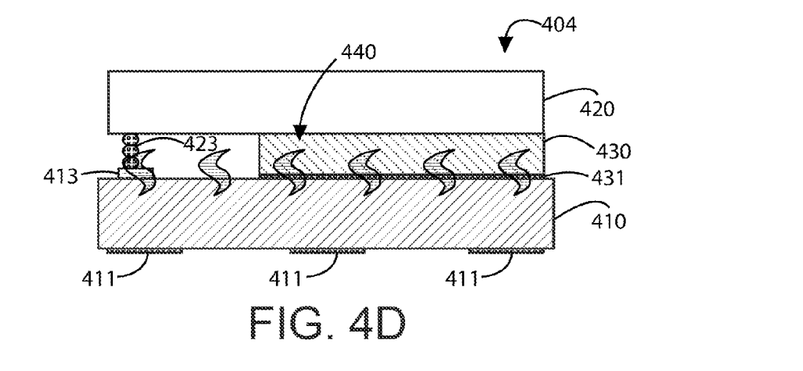
Figure 4E:
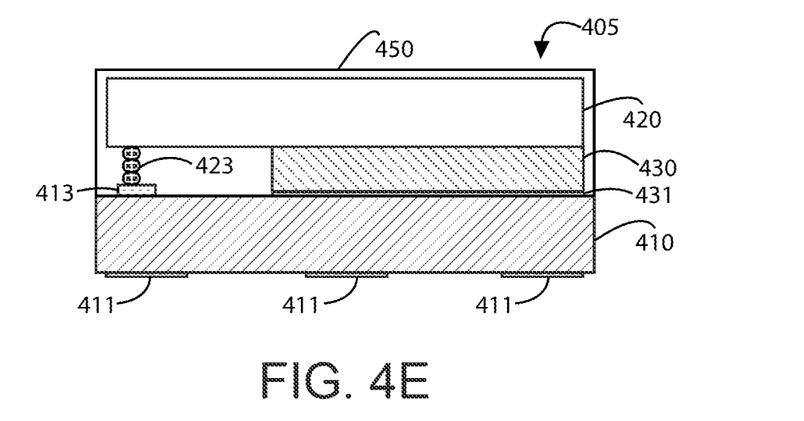
Figure 4F:
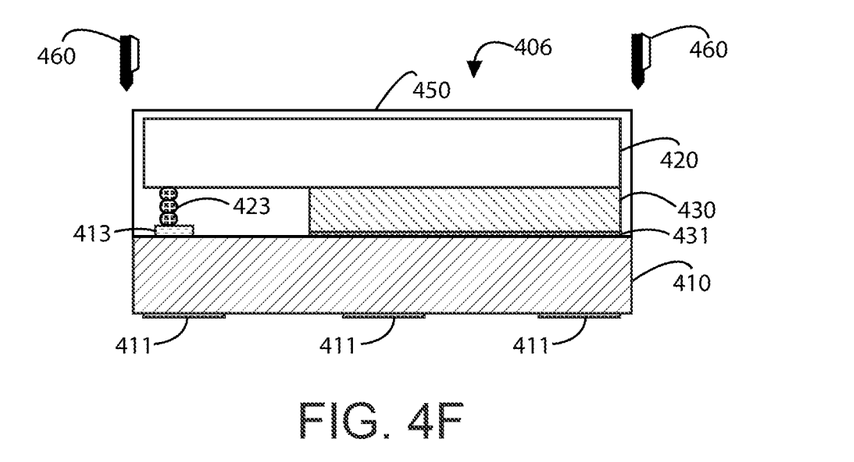

FIG. 4C (403) shows the incoming chip flipped and attached to the substrate 410. Here, the MEMS cap 430 is coupled to the substrate 410 and the CMOS interconnection region 423 of CMOS die 420 is coupled to the interconnection region 413. In a specific embodiment, an interconnect layer 431, such as a dielectric layer, can be provided between the MEMS cap 430 and the substrate 410. The device is then subjected to a reflow process 440 in FIG. 4D (404), which can be used to melt one or more metal materials to form interconnections. The device is enclosed in an encapsulation 450 in FIG. 4E (405) and a package sawing process using saws 460 in FIG. 4F (406).

Figure 5A:
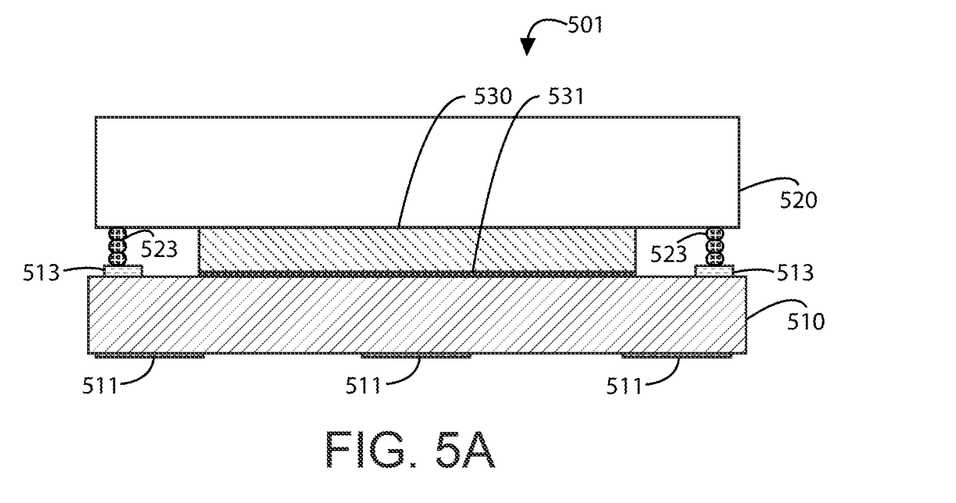
FIG. 5A is a simplified diagram of a packaged MEMS-IC device according to an embodiment of the present invention.

FIG. 5A is a simplified diagram of a packaged MEMS-IC device according to an embodiment of the present invention. As shown, device 501 depicts a dual side bond pad interconnection configuration of a device formed via a method similar to the embodiments of FIGS. 4A-4F. The substrate 510 has contact regions 511 and interconnection regions 513. The MEMS cap 530 houses at least one MEMS device. The CMOS die 520 can include CMOS interconnection regions 523, which is coupled to the interconnection regions 513.

Figure 5B:
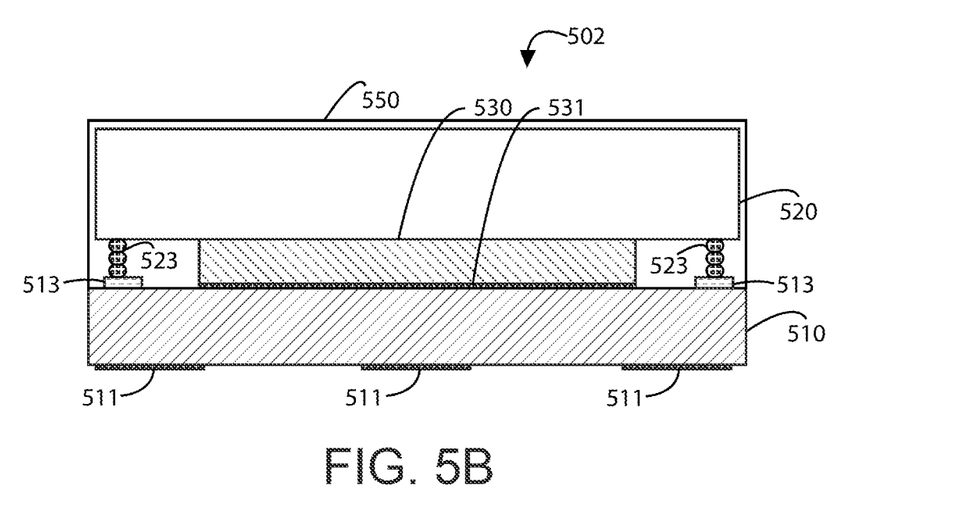
FIG. 5B is a simplified diagram of a packaged MEMS-IC device according to an embodiment of the present invention.

FIG. 5B is a simplified diagram of a packaged MEMS-IC device according to an embodiment of the present invention. Device 502 depicts a similar device to that shown in FIG. 5A with an encapsulation 550 enclosing the CMOS die 520, the MEMS/MEMS cap 530, and the interconnections 513 and 523. There can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A package-level chip scale MEMS packaged device comprising:
    a MEMS chip comprising a CMOS substrate having a top surface having a first portion and a second portion and comprising a cap disposed upon the first portion of the CMOS substrate, wherein the CMOS substrate is associated with a first thickness, wherein the cap is associated with a second thickness, wherein the cap and the first portion of the top surface form an enclosed cavity, wherein at least a MEMS device is formed on the first portion of the top surface and disposed within the enclosed cavity, wherein the second portion of the top surface of the CMOS substrate is substantially free of the cap and includes at least a first bonding region;
    a packaging substrate having a top surface, the top surface having a first portion and a second portion, wherein the first portion is characterized by a third thickness, wherein the second portion is characterized by a fourth thickness, wherein the third thickness exceeds the fourth thickness by at least the second thickness associated with the cap, wherein the first portion of the top surface of the packaging substrate includes at least a second bonding region;
    wherein the MEMS chip is oriented relative to the packaging substrate such that the second portion of the top surface of the CMOS substrate is opposed to the first portion of the top surface of the packaging substrate, and such that the cap is disposed above the second portion of the top surface of the packaging substrate; and
    wherein the first bonding region is bonded to the second bonding region.

2. The device of claim 1 wherein a sum of the first thickness for the CMOS substrate and the second thickness for the cap is within a range of about 450 microns to about 500 microns.

3. The device of claim 1 wherein the first thickness for the CMOS substrate is within a range of about 300 microns to about 400 microns.

4. The device of claim 1 wherein the second thickness for the cap is within a range of about 100 microns to about 150 microns.

5. The device of claim 1 wherein the third thickness associated with the first portion of the packaging substrate is within a range of about 100 microns to about 200 microns.

6. The device of claim 1 wherein a thickness of the package-level chip scale MEMS package is within a range of about 650 microns to about 750 microns.

7. The device of claim 1
wherein the top surface of the CMOS substrate also includes a third portion, and wherein third portion of the top surface of the CMOS substrate is substantially free of the cap and includes at least a third bonding region;
wherein the top surface of the packing substrate also includes a third portion, wherein the third portion is characterized by the third thickness, and wherein the third portion of the top surface of the packaging substrate includes at least a fourth bonding region;
wherein the MEMS chip is oriented relative to the packing substrate such that the third portion of the top surface of the CMOS substrate is opposed to the third portion of the top surface of the packaging substrate; and
wherein the third bonding region is bonded to the fourth bonding region.

8. The device of claim 7
wherein the first portion of the top surface of the CMOS substrate is laterally disposed between the second portion of the top surface of the CMOS substrate and the third portion of the top surface of the CMOS substrate.

9. The device of claim 8
wherein the first bonding region is electrically coupled to the second bonding region; and
wherein the third bonding region is electrically coupled to the fourth bonding region.

10. The device of claim 9
wherein the first bonding region is electrically coupled to the second bonding region substantially free of wires; and
wherein the third bonding region is electrically coupled to the fourth bonding region substantially free of wires.

11. The device of claim 1
wherein the second portion of the CMOS substrate is characterized by a first area;
wherein the MEMS chip is characterized by a second area; and
wherein the first area is larger than the second area within a range of about 40% to about 50%.

12. The device of claim 1 wherein the MEMS device is selected from a group consisting of: an accelerometer, a gyroscope, a magnetometer, a pressure sensor.

13. The device of claim 1 wherein the second bonding region comprises a pre-solder bump.

14. The device of claim 1 wherein the packaging substrate comprises a bottom surface having a plurality of contacts disposed thereon.

15. The device of claim 14 further comprising an encapsulation material disposed over the MEMS chip and the packaging substrate, wherein the plurality of contacts are substantially free of the encapsulation material.

16. The device of claim 1 wherein the first bonding region is electrically coupled to the second bonding region.

17. The device of claim 16 wherein the first bonding region is electrically coupled to the second bonding region substantially free of wires.

18. The device of claim 16 wherein the first bonding region is electrically coupled to the second bonding region via solder.

19. The device of claim 1 wherein the cap is physically bonded to the second portion of the top surface of the packaging substrate.

20. The device of claim 1 wherein the cap is approximately laterally centered upon the CMOS substrate.

* * * * *